United States Patent
Hof et al.

(10) Patent No.: US 8,654,345 B2
(45) Date of Patent: Feb. 18, 2014

(54) OPTICAL SYSTEM, IN PARTICULAR IN A MICROLITHOGRAPHIC PROJECTION EXPOSURE APPARATUS

(75) Inventors: Albrecht Hof, Aalen (DE); Dietmar Neugebauer, Aalen (DE); Rolf Freimann, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 13/368,541

(22) Filed: Feb. 8, 2012

(65) Prior Publication Data
US 2012/0140241 A1 Jun. 7, 2012

Related U.S. Application Data

(63) Continuation of application No. PCT/EP2010/063158, filed on Sep. 8, 2010.

(60) Provisional application No. 61/247,142, filed on Sep. 30, 2009.

(30) Foreign Application Priority Data

Sep. 30, 2009 (DE) .......................... 10 2009 043 501
Dec. 17, 2009 (DE) .......................... 10 2009 054 860

(51) Int. Cl.
*G01B 11/02* (2006.01)

(52) U.S. Cl.
USPC ........................................................ 356/498

(58) Field of Classification Search
USPC .................................... 356/482, 486, 493, 498
See application file for complete search history.

(56) References Cited

U.S. PATENT DOCUMENTS

| | | |
|---|---|---|
| 5,144,363 A | 9/1992 | Wittekoek et al. |
| 6,727,980 B2 | 4/2004 | Ota et al. |
| 7,126,671 B2 | 10/2006 | Cox et al. |
| 7,221,460 B2 | 5/2007 | Ohtsuka |
| 7,636,166 B2 | 12/2009 | DeGroot et al. |
| 7,817,248 B2 | 10/2010 | Kwan |
| 7,821,726 B2 | 10/2010 | Nawata et al. |
| 2003/0081717 A1 | 5/2003 | Eppler et al. |
| 2004/0227107 A1 | 11/2004 | Cox et al. |

(Continued)

FOREIGN PATENT DOCUMENTS

| | | |
|---|---|---|
| EP | 1 465 015 | 10/2004 |
| EP | 1 278 089 | 11/2007 |

(Continued)

OTHER PUBLICATIONS

The German Office Action, with English translation, for corresponding DE Application No. 10 2009 043 501.8-51, dated Jul. 8, 2010.

(Continued)

*Primary Examiner* — Tarifur Chowdhury
*Assistant Examiner* — Jonathon Cook
(74) *Attorney, Agent, or Firm* — Fish & Richardson P.C.

(57) ABSTRACT

An optical system, such as a microlithographic projection exposure apparatus, includes a first optical component, a second optical component, and a measurement arrangement for determining the relative position of the first optical component and the second optical component in six degrees of freedom. The measurement arrangement is adapted to determine the relative position of the first optical component and the second optical component over six different length measurement sections. The length measurement sections extend directly between the first optical component and the second optical component.

20 Claims, 11 Drawing Sheets

(56) References Cited

U.S. PATENT DOCUMENTS

| | | | |
|---|---|---|---|
| 2004/0227207 | A1 | 11/2004 | Barlocchi et al. |
| 2004/0227915 | A1 | 11/2004 | Ohtsuka |
| 2005/0063288 | A1 | 3/2005 | Nawata et al. |
| 2007/0171425 | A1 | 7/2007 | De Groot et al. |
| 2008/0212083 | A1 | 9/2008 | Kwan |

FOREIGN PATENT DOCUMENTS

| | | |
|---|---|---|
| JP | 2004-343078 | 12/2004 |
| JP | 2005-175177 | 6/2005 |
| JP | 2008-130850 | 6/2008 |
| JP | 2008-543070 | 11/2008 |
| JP | 2009-026862 | 2/2009 |
| JP | 2009-043906 | 2/2009 |
| JP | 2009-524064 | 6/2009 |
| WO | WO 2005/083487 | 9/2005 |
| WO | WO 2006/128713 | 12/2006 |

OTHER PUBLICATIONS

Rainer Wilhelm et al., "A novel, low coherence fibre optic interferometer for position and thickness measurements with unattained accuracy," Proceedings of the SPIE 6189 (2006) Optical Sensing II.

Rainer Wilhelm et al., "Dimensional metrology for the fabrication of imaging optics using a high accuracy low coherence interferometer," Optical Measurement Systems for Industrial Inspection IV, W. Osten, C. Gorecki, E. Novak, eds., Proc. SPIE vol. 5856, pp. 469-480, 2005.

The International Search Report and Written Opinion for corresponding PCT/EP2010/063158, dated Apr. 1, 2011.

D. Stewart, "A Platform with Six Degrees of Freedom," UK Institution of Mechanical Engineers Proceedings 1965-66, vol. 180, Pt 1, No. 15.

Sommese et al., *The Numerical Solution of Systems of Polynomials: Arising in Engineering and Science*, World Scientific Pub Co Inc., Mar. 21, 2005, pp. 104-111 and 154-157.

English translation of German Office Action for corresponding DE Application No. 10 2009 043 501.8-51, dated Jul. 8, 2010.

The International Preliminary Report on Patentability for corresponding PCT/EP2010/063158, dated Apr. 12, 2012.

Korean Office Action, with translation thereof, for corresponding KR Appl No. 10-2012-7011154, dated Jun. 13, 2013.

Japanese Office Action, with translation thereof, for corresponding JP Appl No. 2012-530208, dated Jul. 10, 2013.

Taiwanese Office Action and Search Report, with English translation, for corresponding TW Appl No. 99132752, dated Sep. 12, 2013.

OPTICAL SYSTEM, IN PARTICULAR IN A MICROLITHOGRAPHIC PROJECTION EXPOSURE APPARATUS

CROSS-REFERENCE TO RELATED APPLICATIONS

This application is a continuation of, and claims benefit under 35 USC 120 to, international application PCT/EP2010/063158, filed Sep. 8, 2010, which claims benefit under 35 USC 119 of German Application No. 10 2009 043 501.8, filed Sep. 30, 2009 and German Application No. 10 2009 054 860.2, filed Dec. 17, 2009, and under 35 USC 119(e) of U.S. Ser. No. 61/247,142, filed Sep. 30, 2009. International application PCT/EP2010/063158 is hereby incorporated by reference in its entirety.

FIELD

The disclosure concerns an optical system and a method of determining the relative position of components of an optical system, in particular in a microlithographic projection exposure apparatus.

BACKGROUND

Microlithography is used for the production of microstructured components such as for example integrated circuits or LCDs. The microlithography process is carried out in what is referred to as a projection exposure apparatus having an illumination system and a projection objective. In that case the image of a mask (=reticle) illuminated via the illumination system is projected via the projection objective on to a substrate (for example a silicon wafer) which is coated with a light-sensitive layer (photoresist) and arranged in the image plane of the projection objective in order to transfer the mask structure on to the light-sensitive coating on the substrate.

Mirrors are used as optical components for the imaging process in projection objectives designed for the EUV range (that is to say at wavelengths of for example about 13 nm or about 7 nm), due to the general lack of availability of suitable translucent refractive materials. In operation of such projection objectives which are designed for EUV, in which mask and wafer are usually moved relative to each other in a scanning process, because the positions of the mirrors which are in part movable in all six degrees of freedom both relative to each other and also relative to the mask or wafer, it may be desirable for their positions to be adjusted and maintained with a high level of accuracy to avoid or at least reduce aberrations and adverse effects that they entail in the imaging result.

It is known, in addition to a carrier structure which carries interchangeable elements such as aperture plates or actuators, to provide a measurement structure which is typically arranged outside the carrier structure and which is intended to ensure thermally and mechanically stable fixing of position sensors or other measurement systems for determining the mirror positions. A projection exposure apparatus having a measurement frame and a load-carrying frame is disclosed, for example, in EP 1 278 089 B1.

WO 2006/128713 A2 and US 2008/0212083 A1 disclose, among other things, a measurement arrangement in a projection objective of a microlithographic projection exposure apparatus, where the measurement arrangement measures the spatial relationship between at least two components of the imaging system, and a reference element is mechanically mounted directly to one of the components.

EP 1 465 015 A1 discloses, among other things, a projection exposure apparatus designed for EUV where the relative positions of the mirrors with respect to each other are measured directly by an interferometric mechanism or a capacitive mechanism.

U.S. Pat. No. 6,727,980 B2 discloses implementing system adjustment with higher wavelengths different from the actual working wavelength.

SUMMARY

The present disclosure provides an optical system, in particular in a microlithographic projection exposure apparatus, which permits ascertainment or adjustment of the relative position of optical components with respect to each other with very high accuracy, and adaptation of the sensitivity of the measurement arrangement to the sensitivity of the degrees of freedom.

An optical system, in particular in a microlithographic projection exposure apparatus, includes a first optical component, a second optical component, and a measurement arrangement for determining the relative position of the first optical component and the second optical component in six degrees of freedom. The measurement arrangement is adapted to determine the relative position of the first optical component and the second optical component over six different length measurement sections. The length measurement sections extend directly between the first optical component and the second optical component.

The disclosure is based in particular on the concept of dispensing with auxiliary structures or reference elements when determining the relative position of the optical components (in particular EUV mirrors in a projection objective designed for EUV) with respect to each other in all six respective degrees of freedom of rigid bodies. That is to say, the measurement operations in question for ascertaining the six degrees of freedom are performed directly between the components in question themselves. In other words, in accordance with the disclosure, only length measurement devices are used, which act directly between the first and the second optical component. In that way it is possible to dispense with the additional and thus cost-incurring measurement structure referred to above, while the carrier structure referred to above can be produced less expensively because it can be made from a less expensive material. For example it is possible to use an iron-nickel alloy such as Invar® instead of a glass ceramic such as Zerodur® in spite of the lower stiffness thereof, because less accurate a-priori positioning of the optical components relative to each other can be corrected again by the operation according to the disclosure of determining the relative position of the optical components with respect to each other and subsequent adjustment.

Insofar embodiments of the disclosure dispense with (external) reference elements for determining the relative positions of the optical elements, such embodiments can also makes use of the fact that ultimately (only) the relative position of the mirrors with respect to each other is of relevance for the lithography process. In addition, the design of the measurement arrangement with six different measurement sections makes it possible to take account in specifically targeted fashion of the presence of particularly important ones of the foregoing six degrees of freedom, in that the orientation of the individual measurement sections is effected in such a way that the operation of determining the relative positions is effected with a comparatively higher degree of sensitivity or accuracy in relation to such degrees of freedom which are to be viewed as particularly important in the specific optical system. Thus the sensitivity can be adapted to the sensitivity of the degrees of freedom by a suitable geometry of the measurement arrangement.

A further advantage of the relative position-determining operation which in accordance with the disclosure is effected directly between the optical components is that the measurement arrangement according to the disclosure includes separation in principle of the (relative) positional measurement of the optical components or mirrors from the actuator system causing the movement of the components or mirrors so that unwanted reaction forces of the actuator system can be avoided or at least kept away from the sensitive region of the optical system.

The interferometers usually employed (and also measurement bars) operate incrementally, wherein after being switched on the offset is to be appropriately established by for example moving to reference marks. In the present case it is sufficient for the measurement systems to be set in the parking position of the mirrors to a value established previously (for example during operational initialisation) with another approach. The uncertainty of that offset is substantially higher than the desired resolution for the measurement of changes in position and can be in the μm range.

In accordance with an embodiment the measurement sections are arranged in a geometry of a Stewart-Gough platform, that is to say in a geometry of a hexapod. Here and hereinafter that means that the 'legs' of the hexapod, which are usually implemented as corporeal units, are in the form of (non-corporeal) measurement sections, as is further described in greater detail hereinafter with reference to FIGS. 1 and 2.

The disclosure however is not limited to the geometry of a hexapod so that basically other arrangements of the measurement sections can also be suitable insofar as they allow clear determination of the relative position of the first component and the second component in all six degrees of freedom. In other words, the resulting mathematical system of equations for ascertaining the relative position from measurement results can be clearly resolved.

In an embodiment at least two of the measurement sections can overlap or cross each other. In particular all measurement sections can be so arranged that two respective measurement sections overlap in pairs and possibly also go through the volume region used for EUV imaging. Such an arrangement is advantageous in particular from aspects relating to technology of structural space, that is to say in regard to improved or optimised utilisation of the structural space, and makes use of the fact that—unlike the situation for example with a hexapod which is of an actual corporeal structure—basically the entire space available due to the geometry of the measurement arrangement can be used for arranging the measurement sections. In addition such an 'overlapping arrangement' can also increase the sensitivity of the operation of determining relative positions in certain degrees of freedom, in which respect preferably once again such degrees of freedom which are to be viewed as particularly important in the specific optical system are in turn selected for that purpose.

In accordance with an embodiment the measurement arrangement has at least one interferometer and in particular a respective interferometer for each of the measurement sections. The disclosure however is not limited to interferometric measurement sections but also embraces implementations via other contactless measurement principles such as for example capacitive measurement sections, inductive measurement sections or also the use of measurement scales which can be read off by via suitable reading devices, as is described in greater detail hereinafter.

The disclosure further concerns a method of determining the relative position of components of an optical system, in particular in a microlithographic projection apparatus, including a first optical component and a second optical component, wherein the relative position of the first optical component and the second optical component is ascertained in six degrees of freedom only via length measurement sections which act exclusively between the first optical component and the second optical component.

For preferred configurations and advantages of the method attention is directed to the foregoing description in connection with the optical system according to the disclosure.

A catoptric projection objective for microlithography, in which some or all mirrors are measured in the manner according to the disclosure with respect to their position relative to each other in relation to the six degrees of freedom can involve lower manufacturing costs by virtue of dispensing with an additional measurement frame and the lower desired stiffness of the carrier structure. In addition there is the advantage of complete decoupling of the measurement device for positional positioning of the mirrors relative to each other from the mounting technology involved therewith so that no unwanted forces or moments are applied to the carrier structure and thus indirectly to the mirrors, by the measurement device.

The disclosure further concerns a projection objective of a microlithographic projection exposure apparatus designed for operation in EUV, including a multiplicity of mirrors, and a measurement arrangement for determining the relative position of all of the mirrors with respect to each other, wherein the measurement arrangement is adapted to use exclusively the mirrors themselves as reference objects in determining the relative position.

Consequently it is possible in particular to dispense with a mechanical connection of the mirrors in relation to the outside world, that is to say to structures disposed outside the mirror arrangement, as only the relative positions of the mirrors with respect to each other (and not their position relative to a third object such as for example a reference frame—which according to the disclosure is not needed) are measured.

In an embodiment the measurement arrangement is adapted to determine the position of each of the mirrors directly relative to another of the mirrors, preferably a mirror which is respectively adjacent in the optical beam path.

In an embodiment the measurement arrangement is insensitive to changes in position of a mirror relative to the external environment of the projection objective if the changes in position entail a change in position of the other mirrors, that leads to maintaining the same relative positions of the mirrors with respect to each other.

In an embodiment the mirrors are held by a holding structure, wherein all mirrors are in operative contact exclusively with the holding structure. That operative contact can be provided at least partly by way of electromagnetic forces.

For example the individual mirrors can be held via Lorentz actuators in their exact (finely adjusted) positions. In that case optionally one or more mirrors can also additionally be in contact with a mechanical holding structure. Furthermore the weight of the mirrors can be carried via a gravitational force compensator.

In a further aspect the disclosure concerns a method of mounting a projection objective for microlithography, wherein the projection objective has a multiplicity of mirrors which during mounting are oriented in their working position wherein the orientation operation is effected using adjustment light of an adjustment wavelength. The method is characterised in that the adjustment wavelength—like—the working wavelength—is in the EUV range (in accordance with the present disclosure that is intended to denote the wavelength range of 7 nm to 30 nm, in particular 7 nm to 15 nm).

In that respect the method takes advantage of the fact that, using the length measurement devices used in the measurement arrangement according to the disclosure, which act directly between the EUV mirrors, the positions of the respective EUV mirrors can be determined directly relative to a respective other of the EUV mirrors, preferably an EUV mirror which is respectively adjacent in the optical beam path, that is to say in the course of respective paired orientation of the EUV mirrors, adjustment is already made possible during the mounting operation without using light of another or additional wavelength.

In that respect here and hereinafter the term 'adjustment' is used to denote orientation of the EUV mirrors into their working position for the lithography process, and thus not for example orientation of the wafer in the field of view of the projection objective (which moreover, as is known for example from U.S. Pat. No. 5,144,363, can be implemented at another or higher wavelength).

Consequently both the complication and expenditure involved for adjustment and also the time for assembly of the projection objective until the final positions of the mirrors are reached can be reduced, in which respect it is possible to exploit the fact that an increased level of accuracy is achieved in comparison with using the measurement structure described in the opening part of this specification for the pre-adjustment operation. In that respect it is possible to dispense with an additional (pre)-adjustment operation at a higher wavelength (of for example 193 nm or 248 nm) or a combination of different adjustment steps or with different acquisition ranges.

In a method according to the disclosure the individual EUV mirrors can be moved into their working position during the mounting operation, that is to say in a single mounting/adjustment step, and in that respect the projection objective can already be adjusted during the assembly procedure in such a way that only a concluding wave front checking operation still has to be performed. Preferably in that respect the desired accuracy range is already achieved for the relative positions and orientations of the mirrors with respect to each other, which is to be set in order to keep the degree of aberrations or image defects in optical imaging sufficiently low. The accuracy ranges to be set according to the disclosure can be for example ±10 nm for the positioning operations and ±10 nrad for the orientations of the mirrors.

Consequently in principle there is also the option of already supplying the customer with the projection objective after the mounting operation—and without previous system checking—in which respect the customer can perform the final adjustment with wave front measurement devices or devices which are incorporated in the projection exposure apparatus ('on board').

In particular with the adjustment operation or with orientation of the EUV mirrors in accordance with the disclosure, into their desired or definitive working position employed for the lithography process, it is possible to use light of an adjustment wavelength which at least substantially (for example up to ±10 nm, in particular ±5 nm, further particularly ±3 nm) coincides with the working wavelength used in the lithography process.

Further configurations of the disclosure are to be found in the description and the appendant claims.

BRIEF DESCRIPTION OF THE DRAWINGS

The disclosure is described in greater detail hereinafter via embodiments by way of example illustrated in the accompanying drawings in which.

DETAILED DESCRIPTION OF PREFERRED EMBODIMENTS

Hereinafter reference is firstly made to FIG. 1 to describe the basic concept of the disclosure via a diagrammatic view of a measurement arrangement according to the disclosure in a first embodiment.

Figure 1:
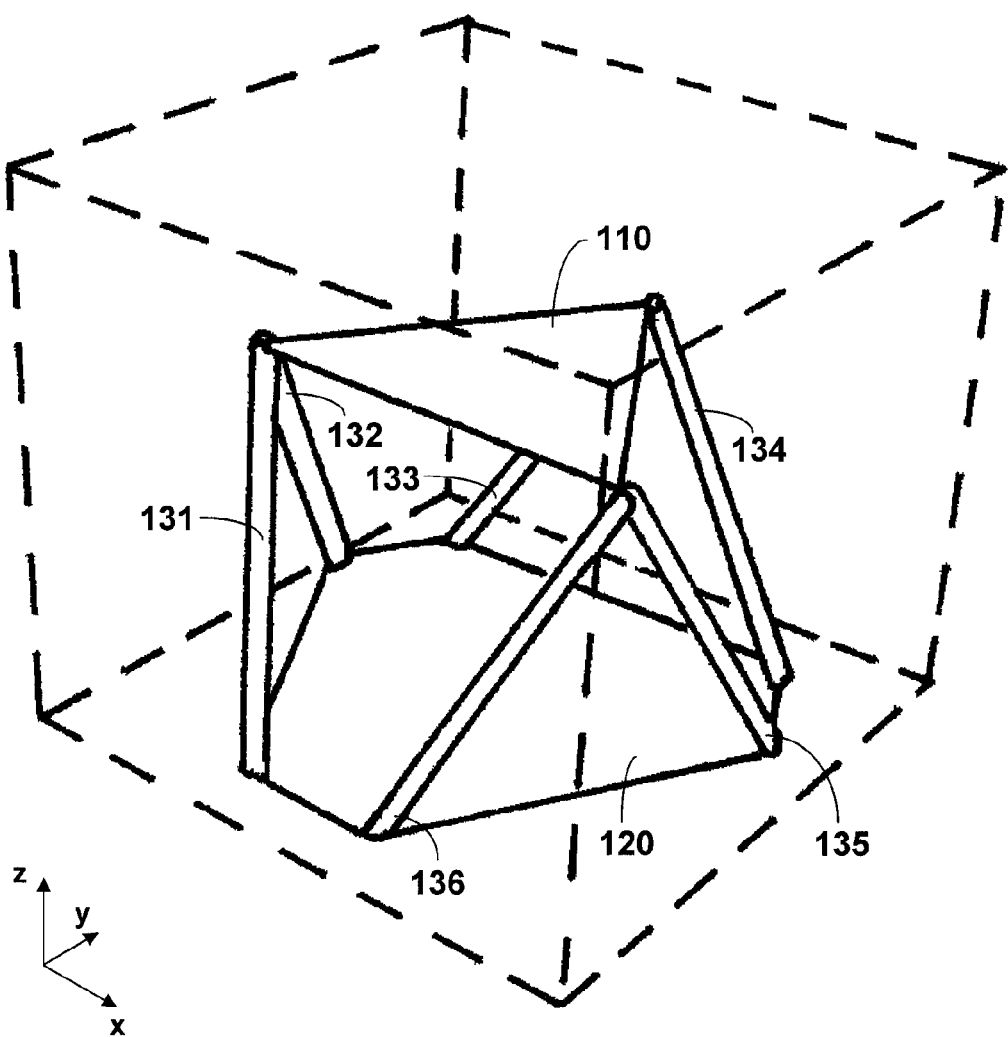
FIG. 1 shows a diagrammatic view to illustrate the structure of a measurement arrangement according to the disclosure in accordance with an embodiment.

In FIG. 1 references 110 and 120 denote portions of EUV mirrors of a projection objective of a microlithographic projection exposure apparatus, wherein for the sake of simplicity hereinafter those portions are equated directly with the EUV mirrors. In addition references 131-136 denote measurement sections or light channels, within which the light passes between the first EUV mirror 110 (the upper one in FIG. 1) and the second EUV mirror 120 (the lower one in FIG. 1). In that respect the beginning of each measurement section 131-136 or each light channel lies on one of the EUV mirrors 110, 120 and the respective end is on the other of the EUV mirrors 120, 110.

Measurement sections or light channels 131-136 are designed so that they allow the relative position of the second EUV mirror 120 with respect to the first EUV mirror 110 to be determined in (all) six degrees of freedom. In that respect ultimately these six degrees of freedom include in the usual way three space co-ordinates and three angle co-ordinates for defining the unique relative position, but in accordance with the disclosure are ascertained by way of six length measurements along the measurement sections 131-136. What is important in that respect is that those measurement sections 131-136 are sufficiently independent of each other or different from each other so that by virtue of the length measurements it is also actually possible to conclude all of the above-mentioned six degrees of freedom, in mathematically clearly resolvable fashion.

The arrangement of the measurement sections or light channels 131-136 in FIG. 1 corresponds to the geometry of a so-called Stewart-Gough platform (also referred to as the 'Stewart platform' or hexapod, see D Stewart: 'A Platform with Six Degrees of Freedom', UK Institution of Mechanical Engineers Proceedings 1965-66, Vol 180, Pt 1, No 15), in which respect however the 'legs' of the hexapod, that are usually implemented in corporeal fashion, are in the form of non-corporeal measurement sections. For explanatory purposes FIG. 11 firstly shows a per se known hexapod with two plates 10, 20 which are connected together by way of six 'legs' 31-36 and are movable relative to each other. In that respect in the illustrated situation (with one concrete arrangement both of the legs 31-36 and also the plates 10, 20 relative to each other), taking the length of the connections or legs 31-36 between the two plates 10, 20, it is possible to calculate the position of the one ('moved') plate relative to the other ('base') plate, with respect to all six degrees of freedom.

The equations to describe the geometrical relationship between the two plates/EUV mirrors are polynomials.

In that respect each degree of freedom x, y, z, Rx, Ry, Rz can be described with a polynomial. The mathematical properties of the resulting equation systems, the question of resolvability and optionally the construction of equations are discussed for example in Andrew J Sommerse, Charles W Wamper: 'The Numerical Solution of Systems of Polynomials', Word Scientific Publishing, Singapore, 2005, and are well-known to those skilled in the art.

Figure 11:
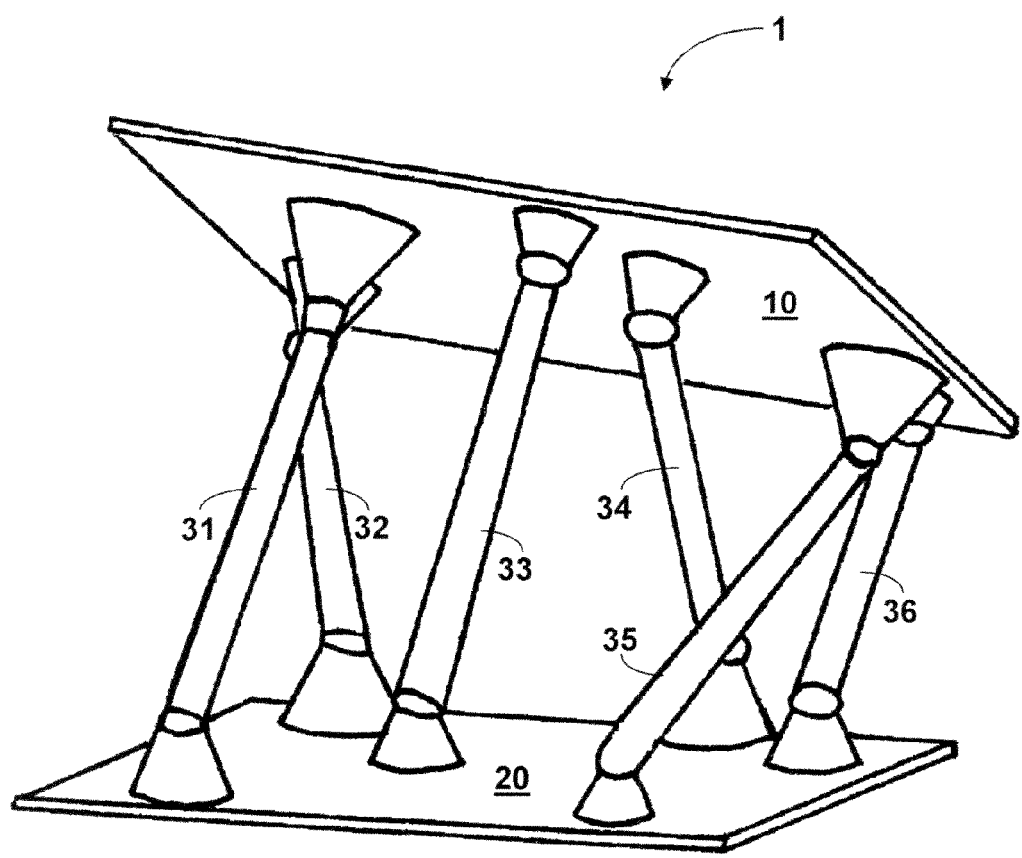
FIG. 11 shows a view of a known Stewart-Gough platform.

It is to be noted that positions of the legs or plates are possible, which are singular, which for the familiar mechanical Stewart-Gough platform as shown in FIG. 11 signifies that the plates 10, 20 can no longer be moved out of that position via changes in length of the legs 31-36, that is to say the platform is blocked in itself. For the concept of the present disclosure, with respect to which the 'legs' of the hexapod are in the form of non-corporeal measurement sections, the consequence of such an arrangement is that the equation system either becomes insoluble or has many solutions. In addition, it is possible to specify arrangements of the legs 31-36 in which the plates 10, 20 can no longer be moved in all degrees of freedom (if for example all six legs 31-36 are arranged parallel to each other and perpendicular to the plates 10, 20, in which case the plate 10 can no longer be displaced in the x-y plane or rotated about the z-axis). In general it can be established that such arrangements of the legs 31-36 in FIG. 11, which do not lead to equation systems that can be solved, upon being transferred to the measurement sections according to the disclosure, have the consequence that the position of the two objects or mirrors relative to each other cannot be determined from the measurements. The present application sets forth examples of the available, possible or meaningful—as they can always be uniquely solved—arrangements of the legs or measurement sections.

A substantial advantage of the arrangement according to the disclosure of six different measurement sections between the first EUV mirror 110 and the second EUV mirror 120 is that to a certain extent flexible adaptation of the levels of sensitivity occurring in the respective degrees of freedom (that is to say in the respective spatial directions or angles) to the specific factors or desired properties, in particular of the optical design, is possible to a certain extent. Thus for example a suitable arrangement of the measurement sections 131-136 makes it possible to achieve more sensitive measurement for those degrees of freedom or directions in which relative positional determination in the specific optical system is of greater importance than in other directions or degrees of freedom.

Figure 2:
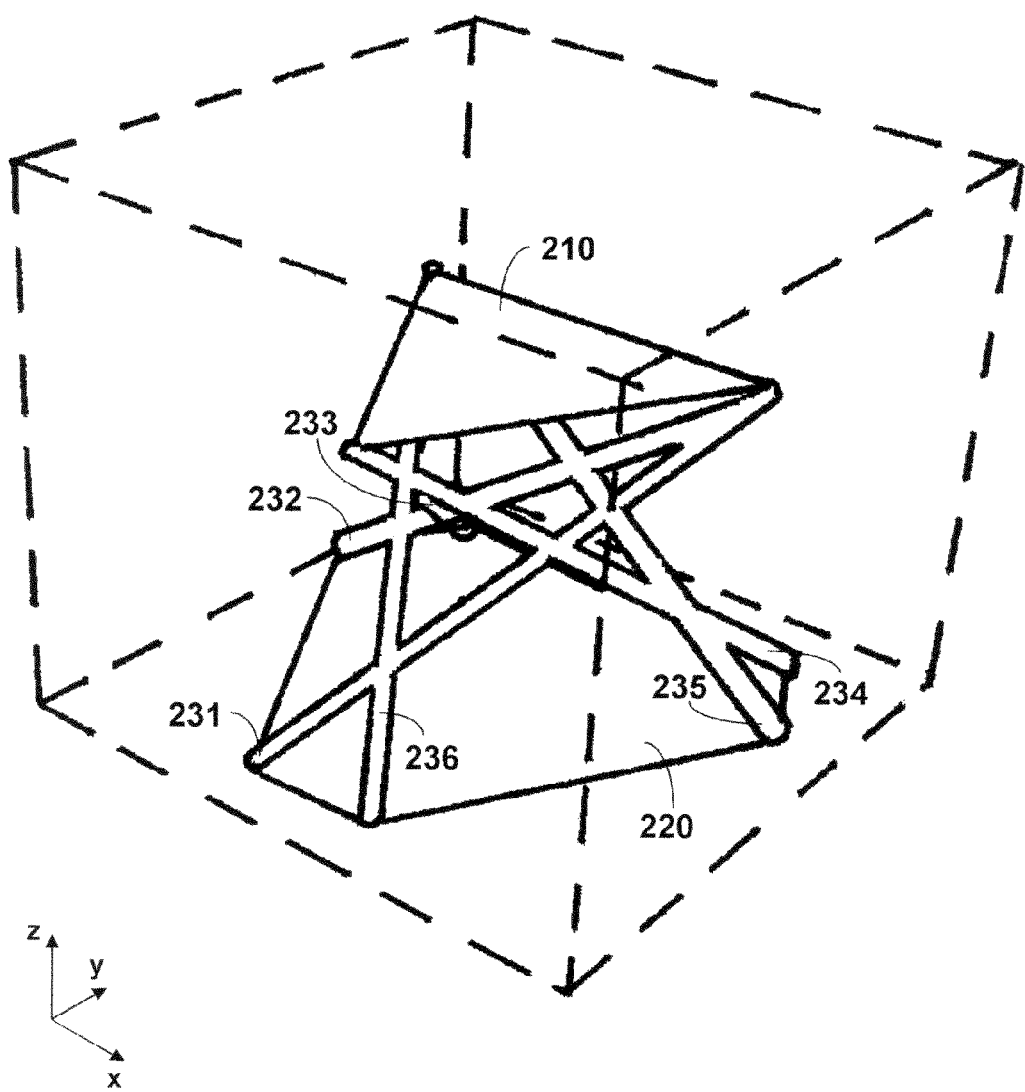
FIG. 2 shows a diagrammatic view to illustrate the structure of a measurement arrangement according to the disclosure in accordance with a further embodiment.

FIG. 2 shows an alternative configuration, wherein elements which are similar to each other or which involve substantially the same function are referred to by references increased by '100'. In the FIG. 2 embodiment two respective measurement sections cross or intersect in paired relationship.

As is readily apparent from FIG. 2 improved utilisation of the available structural space can be achieved by that overlapping or crossing relationship.

On the other hand—as a consequence of the more pronounced inclined positioning of the measurement sections, that the overlapping relationship involves—the measurement arrangement enjoys greater sensitivity in certain spatial directions or in relation to given relative changes in position of the EUV mirrors, wherein those spatial directions can in turn be precisely so selected that in the specific optical system involved they correspond to particularly important spatial directions. The orientation and precise arrangement of the measurement sections are therefore preferably so effected as to also give the maximum sensitivity for the degrees of freedom which are to be determined as accurately as possible. Thus for example to achieve a comparatively high level of sensitivity in the z-direction, the measurement sections 131-136 and 231-236 respectively can substantially also preferably be arranged in the z-direction whereas the measurement sections 131-136 and 231-236 can be arranged in an inclined position to achieve a comparatively high level of sensitivity in the y-direction.

Figure 9:
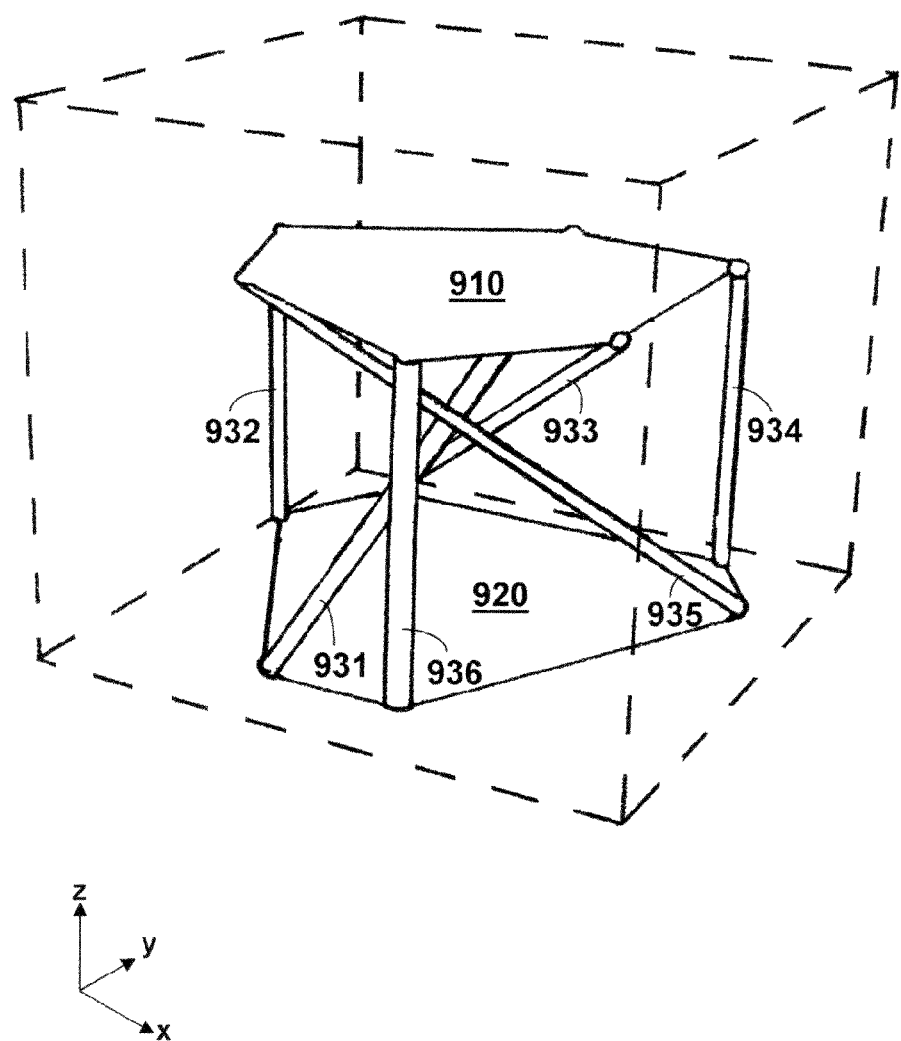
FIG. 9 shows a diagrammatic view to illustrate the structure of a measurement arrangement according to the disclosure in accordance with a further embodiment.

FIG. 9 shows an arrangement of measurement sections 931-936 in which three measurement sections, namely the measurement sections 932, 934 and 936, are parallel to each other. Particularly small measurement uncertainties are achieved by that arrangement in the z-direction (as the arrangement is particularly 'stiff' in the z-direction).

Without the disclosure being limited thereto the measurement sections can be for example in the form of interferometric measurement sections both in the structure in FIG. 1 and also in the structures in FIG. 2 or FIG. 9. Light coupling-in and light coupling-out is then preferably effected in the above-described embodiments using optical waveguides which are not shown in FIGS. 1, 2 and 9 and which preferably respectively end at the beginning and the end of each measurement section (for example the measurement sections 131-136 in FIG. 1) and respectively pass light of a light source (typically in particular a laser) to the measurement section and couple the light into and couple it out of the respective light channel 131-136, as is described in greater detail hereinafter. Such coupling-in and coupling-out can be effected in spaced relationship, that is to say without mechanical contact with respect to the optical waveguides with the measurement sections and in particular the optical system. In that way, no forces or moments are applied to the optical system by the connection of the optical waveguides.

Figure 3:
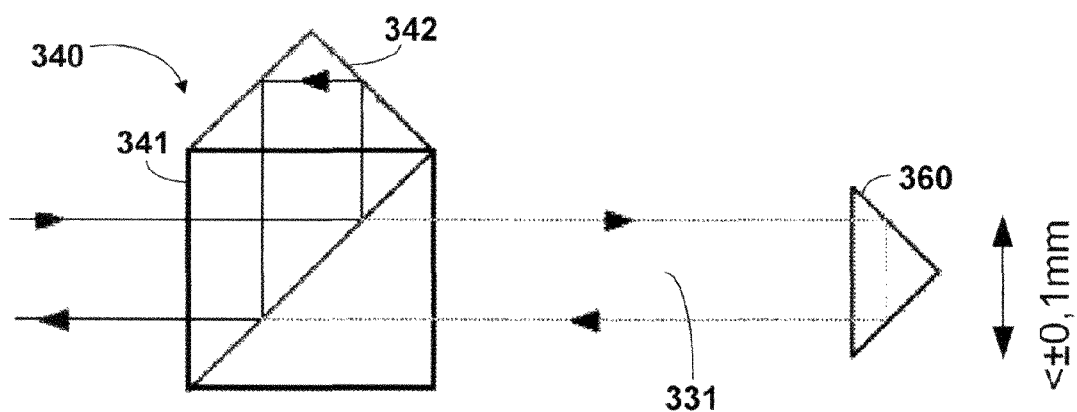
FIGS. 3-5 show diagrammatic views to illustrate the structure of interferometers which can be used by way of example in accordance with the disclosure.

In particular the arrangement can involve interferometric measurement sections with termination by triple prisms as shown in FIG. 3. In that case a beam splitter cube 341 with triple prism 342 which together form an interferometer 340 can be arranged at one of the EUV mirrors 110 and a further triple prism 360 forming a retroreflector can be arranged at the other of the EUV mirrors 120, wherein the light channel extending therebetween, that is to say the actual measurement section, is denoted by reference 331 in FIG. 3.

In regard to the arrangement of those interferometers it is for example possible for all of the total of six interferometers 340 to be arranged on the same EUV mirror and for the retroreflectors 342 to be arranged on the other EUV mirror. In alternative embodiments any smaller number of interferometers 340 can also be arranged at one of the EUV mirrors 110 and the other interferometers can be arranged at the respective other one of the EUV mirrors 120, in which case again associated with each of the interferometers on an EUV mirror is a retroreflector on the respective other EUV mirror.

Figure 4:
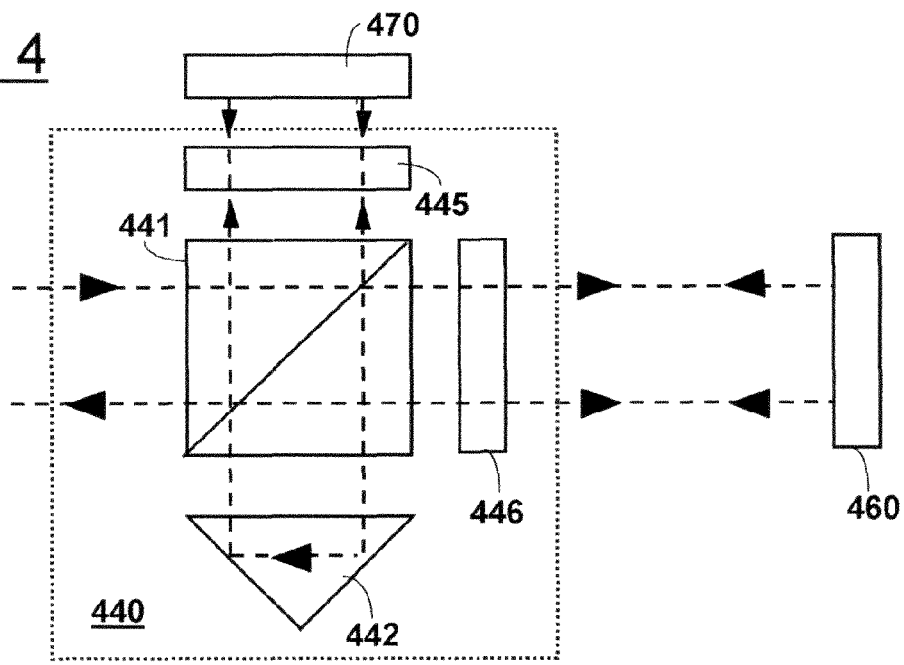

Although the disclosure can be implemented using interferometers with triple prisms as shown in FIG. 3 a further possible embodiment is described hereinafter with reference to FIG. 4, using plane mirror interferometers.

With such a plane mirror interferometer which in a basically known structure has in particular a beam splitter cube 441 and lambda/4 plates 445, 446 by which the light is deflected to a first plane mirror 460 and a second plane mirror 470, the relative position of the second plane mirror 470 relative to the first plane mirror 460 can be measured in per se known manner. In that case the plane mirrors 460, 470 can be arranged on the respective EUV mirrors of the projection objective (that is to say for example on the EUV mirrors 110, 120 in FIG. 1), whereas the actual interferometer 440 (indicated by the dotted region) is disposed on the load-bearing structure (frame) of the projection objective.

In addition it is also possible for the interferometer 440 together with the first plane mirror 460 to be arranged on one of the EUV mirrors (that is to say for example the EUV mirror 110 of FIG. 1) with the second plane mirror 470 arranged on the other EUV mirror (that is to say for example the other EUV mirror 120 in FIG. 1).

Figure 5:
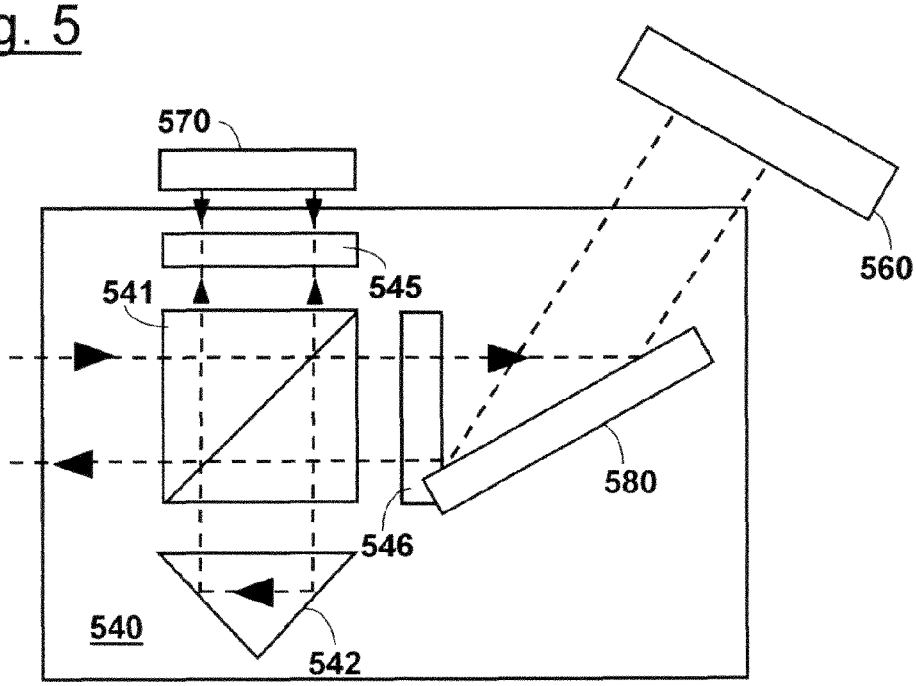

Referring to FIG. 5, deflection of the light incident in the interferometer 540, that is involved with respect to the arrangement defined according to the disclosure of the measurement sections, can be effected by deflection mirrors 580, as is indicated in FIG. 5.

When designing the measurement sections 131-136 and 231-236 in the form of interferometric measurement sections, care is to be taken to ensure that the beams passing into the respective interferometer are already coupled in, in the respectively required direction. As that can be effected only with difficulty or at a level of complication and expenditure that is no longer acceptable, via a beam distributor optical system for dividing the laser beam in the different directions of the individual measurement sections, light coupling-in and light coupling-out are preferably effected using optical waveguides which respectively end directly at the beginning and the end respectively of each measurement section and which respectively feed light from a light source (in particular a laser light source) to the measurement section and couple it into and out of the respective light channel 131-136. Then the interferometers used are preferably those with optical-fiber beam input and output, as are commercially available for example from Renishaw.

In accordance with further embodiments, suitable reference elements in the form of (partially) reflecting optical elements can also be disposed at the optical components or EUV mirrors which are measured in accordance with the disclosure with respect to their relative position, as is described hereinafter with reference to FIGS. 6-8.

Figure 6:
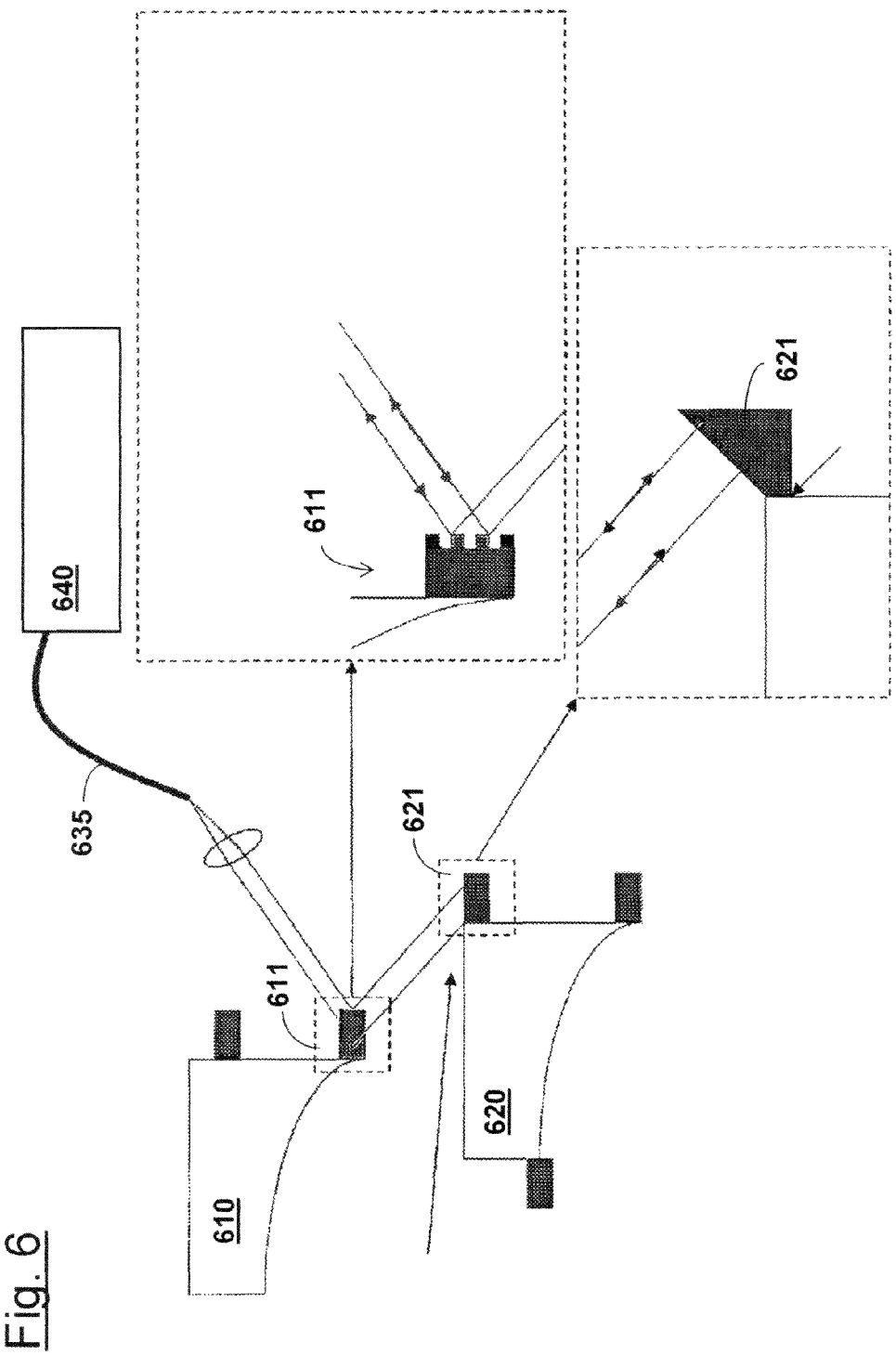
FIGS. 6-8 show further embodiments of the disclosure with mounting of reference elements to the components to be measured with respect to their relative position.

As shown in FIG. 6 a partially reflecting first reference element 611 can be disposed for example at a first EUV mirror 610 and a further (either partially or completely) reflecting second reference element 621 can be disposed at a second EUV mirror 620. For travel length measurement, a short-coherent interferometer 640 is used, wherein coupling-in and coupling-out of the light used for the measurement operation are effected by way of optical-fiber elements or optical waveguides 635.

As diagrammatically shown in FIG. 6 a part of the incident light is reflected back in the direction of incidence at the partially reflecting first reference element 611 and a further part is reflected in the direction towards the (partially or completely) reflecting second reference element 621 at the second EUV mirror 620, wherein the last-mentioned part is reflected and passes back to the short-coherent interferometer 640 by at least partial reflection at the first reference element 611.

The partially reflecting property of the first reference element 611 can be implemented for example by adjacent mirror elements of different orientation, wherein mirror elements having a first orientation reflect or send the incident beam back in itself and mirror elements involving a second orientation provide for passing the light further in a direction towards the second reference element 621. The accuracy of the relative orientation between the EUV mirrors 610 and 620 is determined by the adjustment or identification both of the angle between the two above-described orientations (that is to say the first and second orientations) and also the angle between the second reference element 621 and the second EUV mirror 620.

Detection of the angle between the first and second orientations can be effected for example on an angle measurement station with a turntable, wherein typical measurement uncertainties can occur in the range of $\frac{1}{10}$ through $\frac{1}{100}$ seconds of arc (1 second of arc=50 nrad), or even below that with an improvement in the angle measurement technology involved. Detection of the angle between the second reference element 621 and the second EUV mirror 620 can be effected in the course of direct incorporation of the reference element 621 into the mirror main body and integration of a recording technology which can be qualified with respect to position and angle into the arrangement or arrangements for mirror matching checking In a further embodiment the reference elements on the optical components or EUV mirrors to be measured with respect to their relative position can also be in the form of so-called Littrow gratings.

Figure 7:
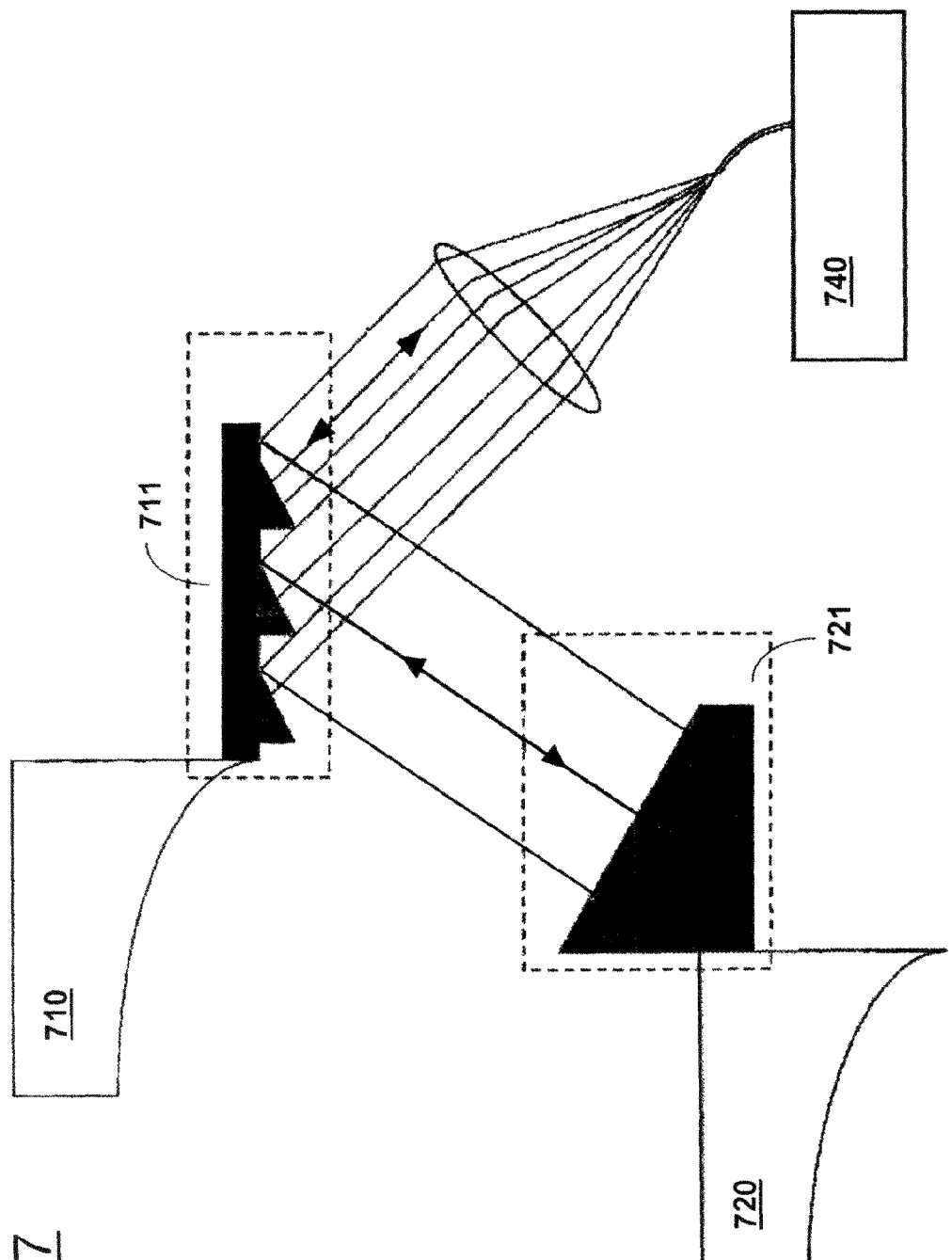

Referring to FIG. 7 a first reference element in the form of a Littrow grating 711, for incident light from the interferometer 740, provides on the one hand for partial retroreflection and on the other hand (in the zero diffraction order) reflection in the direction towards the second reference element 721 on the second EUV mirror 720 by which the light is reflected back and passes back into the interferometer 740 by way of the first reference element or Littrow grating 711. In that case preferably an amplitude grating is used as the grating as phase gratings have a comparatively great groove depth which is greater than the positional measurement uncertainty. Identification of the angle between the optically effective planar surface of the second reference element 721 and the second EUV mirror 720 can again be effected in the course of direct incorporation of the reference element 721 into the mirror main body and integration of a recording technology which can be qualified with respect to position and angle in the arrangement or arrangements for mirror matching checking In accordance with a further embodiment shown in FIG. 8 in addition planar surfaces serving for reflection can be provided directly at the optical components or EUV mirrors which are to be measured with respect to their relative position or integrated in the respective substrate or main body respectively.

Figure 8:
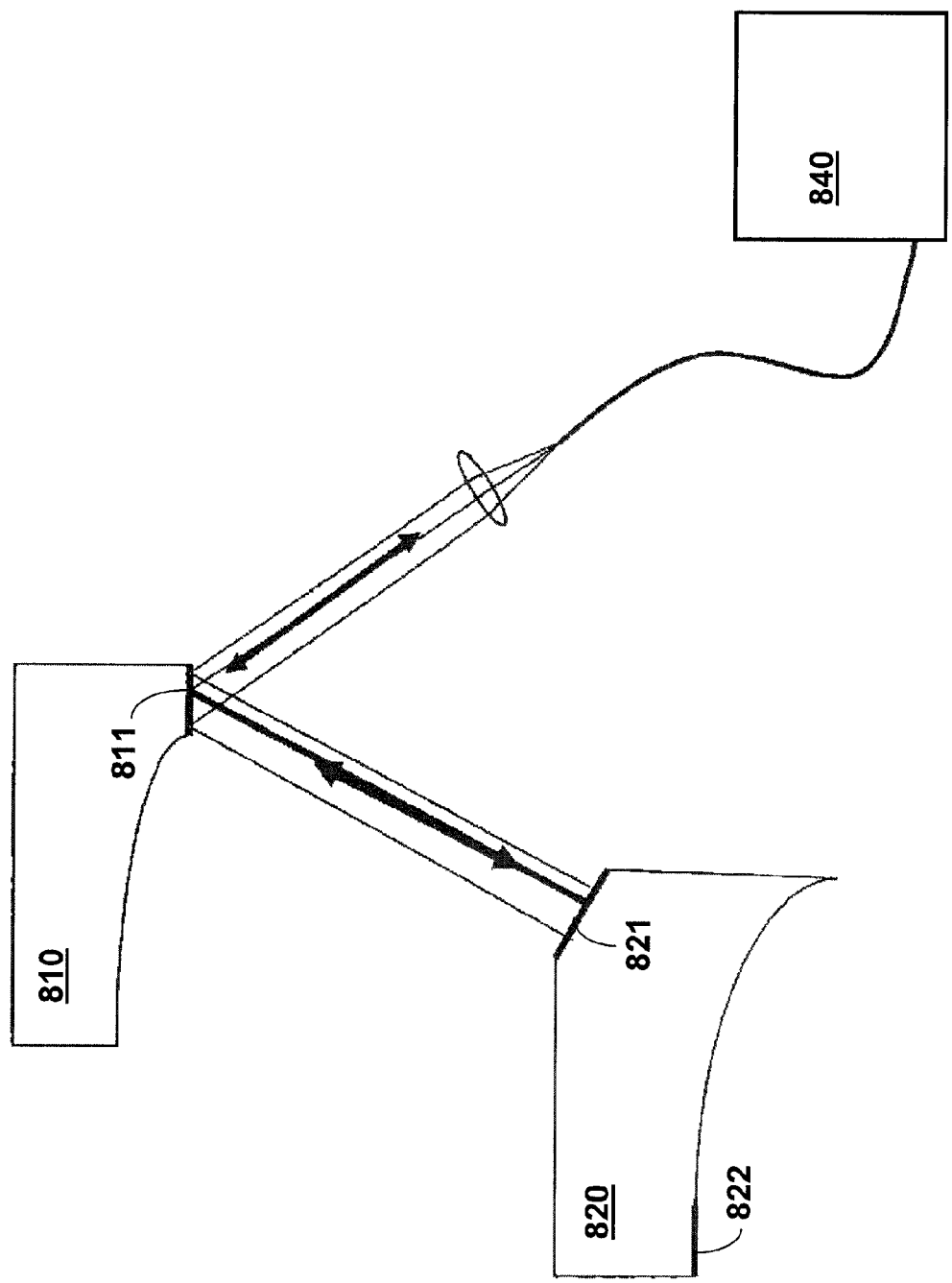

For that purpose provided in FIG. 8 is a first planar surface 811 on a first EUV mirror 810 and provided at a second EUV mirror 820 is a second planar surface 821. The second EUV mirror 820 also has a third planar surface 822 serving for referencing with respect to the mirror surface.

Figure 12:
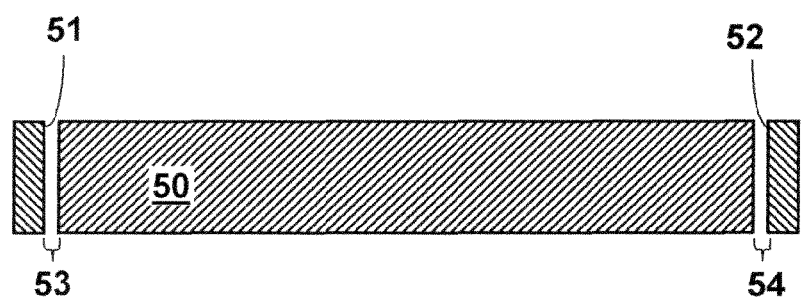
FIG. 12 shows a further view to illustrate a further embodiment of the disclosure.

The disclosure is not limited to interferometric measurement sections but also embraces implementations other contactless measurement principles such as for example capacitive measurement sections, inductive measurement sections or also the use of measuring scales which can be read off by suitable reading devices. As is only diagrammatically illustrated in FIG. 12 for example a mechanical standard spacer gauge 50 of defined length which can be made for example from Zerodur®, Invar® or ULE° can be arranged between two reference surfaces 51, 52 or mirror surfaces to be measured and used for length measurement. So that the standard spacer gauge 50 can be removed without any problem the mirrors having the reference surfaces 51, 52 can be moved back definedly after the mirror mounting operation by way of their associated actuators. In addition gaps 53, 54 remaining between the standard spacer gauge 50 and the reference surfaces 51, 52 can also be capacitively measured if the reference surfaces 51, 52 and the end faces of the gauge 50, that face towards the reference surfaces, are at least region-wise of an electrically conducting nature. If those electrically conducting surfaces are provided for example in four quadrants, orientation of the gauge 50 with respect to the respective reference surface 51, 52 can also be determined.

Figure 10:
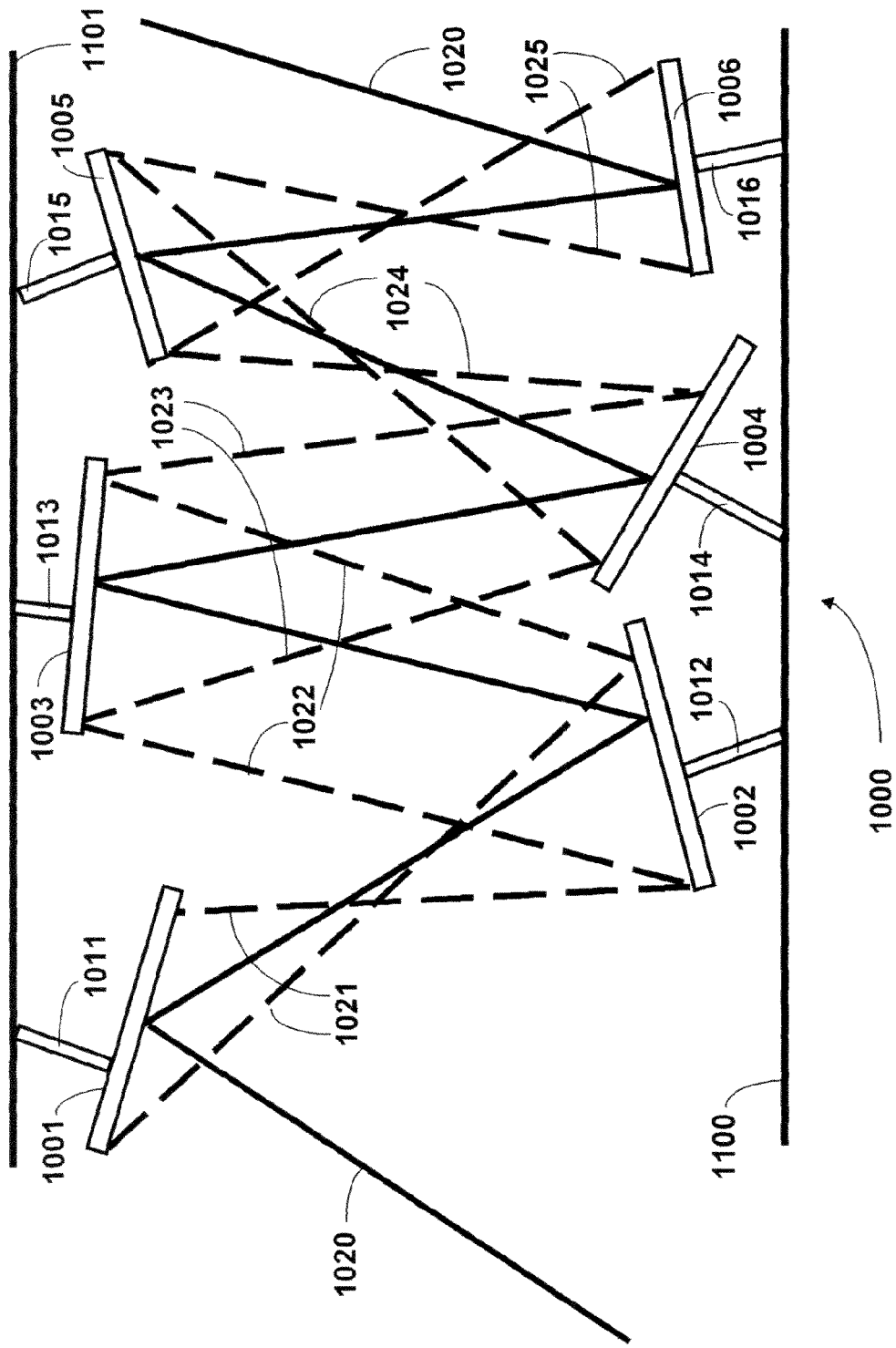
FIG. 10 shows a diagrammatic view of a projection objective according to the disclosure.

As shown in FIG. 10 a catoptric projection objective is provided for microlithography 1000. Six mirrors 1001-1006 of the projection objective are fixed via holders 1011-1016 to an outer carrier structure 1100, 1101 of Invar®. All those mirrors or at least a part thereof are movable in six degrees of freedom and for that purpose are provided with manipulators (not shown here). The solid line 1020 denotes the projection beam path used for imaging the reticle (not shown here) on to the wafer (not shown here). The mirrors 1001-1006 are measured in paired relationship by five measurement section pairs 1021-1025 relative to each other with respect to their position. For the sake of clarity of the drawing only two respective measurement sections per pair of mirrors are illustrated. Both non-penetrating measurement sections 1023 and also penetrating measurement sections 1022 are used as the measurement sections.

Even if the disclosure has been described by reference to specific embodiments numerous variations and alternative embodiments will be apparent to the man skilled in the art, for example by combination and/or exchange of features of individual embodiments. Accordingly it will be appreciated by the man skilled in the art that such variations and alternative embodiments are also embraced by the present disclosure and the scope of the disclosure is limited only in the sense of the accompanying claims and equivalents thereof.

What is claimed is:

1. An objective, comprising:
a first optical component;
a second optical component; and
a measurement arrangement comprising six different length measurement sections,
wherein:
the measurement arrangement is configured to determine a position of the first optical component relative to a position of the second optical component in six degrees of freedom,
the measurement arrangement is configured to determine the position of the first optical component relative to the position of the second optical component over the six different length measurement sections;
each length measurement section extends directly between the first optical component and the second optical component;
at least two of the length measurement sections cross each other; and
the objective is a micro lithographic projection objective.

2. The objective of claim 1, wherein the length measuring sections are arranged in a geometry of a Stewart-Gough platform.

3. The objective of claim 1, wherein the measurement arrangement comprises an interferometer for one of the length measurement sections.

4. The objective of claim 1, further comprising an optical waveguide, wherein the optical waveguide is configured to pass light to a measurement section, or the optical waveguide is configured to carry light away from a measurement section.

5. The objective of claim 1, wherein the six length measurement sections are configured in three pairs, each pair comprising two length measuring sections which cross each other.

6. The objective of claim 1, wherein the first optical component comprises a first EUV mirror, and the second optical component comprises a second EUV mirror.

7. An apparatus, comprising:
an illumination system; and
an objective according to claim 1,
wherein the apparatus is a micro lithographic projection exposure apparatus.

8. An objective, comprising:
optical components; and
measurement arrangements configured to determine positions of the optical components relative to each other in six degrees of freedom,
wherein:
a first one of the measurement arrangements comprises six different length measurement sections;
the first one of the measurement arrangements is configured to determine a position of a first one of the optical components relative to a position of a second one of the optical components over six different length measurement sections;
the six different length measurement sections extend directly between the first optical component and the second optical component, at least two of the measurement sections are selected from the group consisting of two of the length measurement sections that cross each other and two length measuring sections that are parallel to each other; and
the objective is a microlithographic catoptric projection objective.

9. An apparatus, comprising:
an illumination system; and
an objective according to claim 8,
wherein the apparatus is a micro lithographic projection exposure apparatus.

10. The objective of claim 8, wherein two of the length measurement sections cross each other.

11. The objective of claim 8, wherein two of the length measurement sections are parallel to each other.

12. An objective, comprising:
a plurality of mirrors; and
a measurement arrangement configured to determine relative positions of all of the mirrors with respect to each other, the measurement arrangement comprising six different length measurement sections at least two of the measurement sections are selected from the group consisting of two of the length measurement sections that cross each other and two length measuring sections that are parallel to each other,
wherein the measurement arrangement is configured to use exclusively the mirrors themselves as reference objects in determining the relative positions, and the objective is an EUV microlithographic projection objective.

13. The objective of claim 12, wherein the measurement arrangement is configured to determine the position of each of the mirrors directly relative to another of the mirrors.

14. The objective of claim 12, wherein the measurement arrangement is insensitive to changes in position of one of the plurality of mirrors relative to an external environment of the objective if the changes in position of the one of the plurality of mirrors entail a change in position of other mirrors which leads to maintaining the same relative positions of the mirrors with respect to each other.

15. The objective of claim 12, further comprising a holding structure holding the mirrors, wherein all the mirrors are in operative contact exclusively with the holding structure.

16. The objective of claim 15, wherein the holding structure is configured so that electromagnetic forces at least partially provide the operative contact.

17. The objective of claim 15, wherein at least one of the plurality of mirrors is in mechanical operative contact with the holding structure.

18. An apparatus, comprising:
    an illumination system; and
    an objective according to claim 12,
    wherein the apparatus is a micro lithographic projection exposure apparatus.

19. The objective of claim 12, wherein two of the length measurement sections cross each other.

20. The objective of claim 12, wherein two of the length measurement sections are parallel to each other.

* * * * *

UNITED STATES PATENT AND TRADEMARK OFFICE
CERTIFICATE OF CORRECTION

PATENT NO. : 8,654,345 B2
APPLICATION NO. : 13/368541
DATED : February 18, 2014
INVENTOR(S) : Albrecht Hof et al.

It is certified that error appears in the above-identified patent and that said Letters Patent is hereby corrected as shown below:

In the Specification:

Col. 10, line 29, delete "checking" and insert -- checking. --.

Col. 10, line 51, delete "checking" and insert -- checking. --.

Col. 11, line 4, delete "ULE°" and insert -- ULE® --.

In the Claims:

Col. 11, line 66, in Claim 1, delete "micro lithographic" and insert -- microlithographic --.

Col. 12, line 21, in Claim 7, delete "micro lithographic" and insert -- microlithographic --.

Col. 12, line 48, in Claim 9, delete "micro lithographic" and insert -- microlithographic --.

Col. 12, line 59, in Claim 12, delete "sections" and insert -- sections, --.

Col. 13, line 23, in Claim 18, delete "micro lithographic" and insert -- microlithographic --.

Signed and Sealed this
Twenty-seventh Day of May, 2014

Michelle K. Lee
*Deputy Director of the United States Patent and Trademark Office*